(12) United States Patent
Hosokawa

(10) Patent No.: US 6,605,933 B2
(45) Date of Patent: Aug. 12, 2003

(54) POWER METAL OXIDE SEMICONDUCTOR INTEGRATED CIRCUIT

(75) Inventor: Akio Hosokawa, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 147 days.

(21) Appl. No.: 09/820,783

(22) Filed: Mar. 30, 2001

(65) Prior Publication Data

US 2001/0025996 A1 Oct. 4, 2001

(30) Foreign Application Priority Data

Mar. 30, 2000 (JP) ........................................ 2000-093506

(51) Int. Cl.[7] ................................................ G05F 3/16
(52) U.S. Cl. ........................................................ 323/316
(58) Field of Search ................................ 323/313, 314, 323/315, 316; 330/199, 85, 288

(56) References Cited

U.S. PATENT DOCUMENTS 5,266,887 A * 11/1993 Smith ......................... 323/316
5,341,087 A * 8/1994 Van Leeuwen ............. 323/315

FOREIGN PATENT DOCUMENTS

| JP | 7-113826 | 5/1995 |
| JP | 8-149853 | 6/1996 |

* cited by examiner

Primary Examiner—Shawn Riley
(74) Attorney, Agent, or Firm—Young & Thompson

(57) ABSTRACT

A semiconductor device including: a load connected between outputs of power amplifiers; a mirror current generating circuit connected to the power amplifiers in an output side of the power amplifiers for generating a mirror current which is smaller than and proportional to a load current applied to the load, and the mirror current generating circuit being connected out of a current path through the load between the outputs of the power amplifiers; and a mirror current detecting circuit connected to the mirror current generating circuit for detecting the mirror current.

5 Claims, 3 Drawing Sheets

POWER METAL OXIDE SEMICONDUCTOR INTEGRATED CIRCUIT

BACKGROUND OF THE INVENTION

The present invention relates to a semiconductor device, and more particularly to a power metal oxide semiconductor integrated circuit which will hereinafter be referred to as power MOS-IC.

It has been known that the power MOS-IC is used for driving various loads such as a voice coil motor driver for a hard disk drive, a floppy disk driver, and a stepping motor driver for a CD-ROM drive. A conventional power MOS-IC wilt be described. FIG. 1 is a circuit diagram illustrative of a circuit configuration of a first conventional power MOS-IC. The first conventional power MOS-IC has the following circuit elements. A control circuit 313 receives both an input signal Vin from an input power 311 and a reference voltage Vref from an input reference power 312. A first driver circuit 314 is provided which has a first input which is connected to a first output of the control circuit 313 for receiving a first output signal and also has a second input which is connected to a second output of the control circuit 313 for receiving a second output signal. A second driver circuit 315 is provided which has a first input which is connected to the second output of the control circuit 313 for receiving the second output signal and also has a second input which is connected to the first output of the control circuit 313 for receiving the first output signal. A series connection of a load element 316 and a current detecting resistance 321 is provided in series between outputs of the first and second driver circuits 314 and 315. A sense amplifier 323 is provided which has two inputs connected to both sides of the current detecting resistance 321 for receiving a voltage across the current detecting resistance 321. An output of the sense amplifier 323 is connected to an input side of the control circuit 313.

FIG. 2A is a circuit diagram illustrative of each of the first and second driver circuits included in the first conventional power MOS-IC. The driver circuit 211 receives differential signals 212 and 213 and outputs an output signal 214. FIG. 2B is a circuit diagram illustrative of a circuit configuration of the driver circuit of FIG. 2A. The driver circuit 211 comprises a series connection of a p-channel MOS field effect transistor 225 and an n-channel MOS field effect transistor 226 between a high voltage line supplying a voltage VM and a ground line. The p-channel MOS field effect transistor 225 and the n-channel MOS field effect transistor 226 are connected through an output node to each other. The output node is connected to an output terminal from which the output signal appears. The p-channel MOS field effect transistor 225 is connected in series between the output node and the power high voltage line, whilst the n-channel MOS field effect transistor 226 is connected in series between the output node and the ground line. A gate of the p-channel MOS field effect transistor 225 receives the first differential signal 212, whilst a gate of the n-channel MOS field effect transistor 226 receives the second differential signal 213.

A current is applied to the load element 316. The current detecting resistance 321 is connected in series to the load element 316 for detecting a current which flows through the load element 316 in order to control the current applied to the load element 316. The sense amplifier 323 detects any drop of the voltage across the current detecting resistance 321. The conventional power MOS-IC has the following problems.

As described above, in an output side of the power amplifier, the current detecting resistance 321 is connected in series to the load element 316, for which reason a power loss is caused by the current detecting resistance 321. In considerations of both power losses of the load element 316 and the current detecting resistance 321, it is advantageous to reduce the ON-resistances of the above load current control p-channel and n-channel power MOS field effect transistors 225 and 226. The reduction in the ON-resistances of the above load current control p-channel and n-channel power MOS field effect transistors 225 and 226 results in an increase in area of the power MOS field effect transistor. One side voltage of the current detecting resistance 321 is close to the ground level, for which reason the current detecting sense amplifier 323 is needed to have a wide input voltage range. If the current detecting sense amplifier has a narrow input voltage range, then the sense amplifier is inoperable and no control to the current applied to the load element can be obtained.

In the above circumstances, it had been required to develop a novel semiconductor device free from the above problem.

SUMMARY OF THE INVENTION

Accordingly, it is an object of the present invention to provide a novel semiconductor device free from the above problems.

It is a further object of the present invention to provide a novel semiconductor device which is capable of detecting a load current without any power loss to reduce the ON-resistance of the output power MOS field effect transistors and also to reduce the area of the output power MOS field effect transistors.

It is a still further object of the present invention to provide a novel semiconductor device with a current detecting circuit comprising a current detecting sense amplifier free of any restriction to an input voltage range.

The present invention provides a semiconductor device comprising: a load connected between outputs of power amplifiers; a mirror current generating circuit connected to the power amplifiers in an output side of the power amplifiers for generating a mirror current which is smaller than and proportional to a load current applied to the load, and the mirror current generating circuit being connected out of a current path through the load between the outputs of the power amplifiers; and a mirror current detecting circuit connected to the mirror current generating circuit for detecting the mirror current.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1:
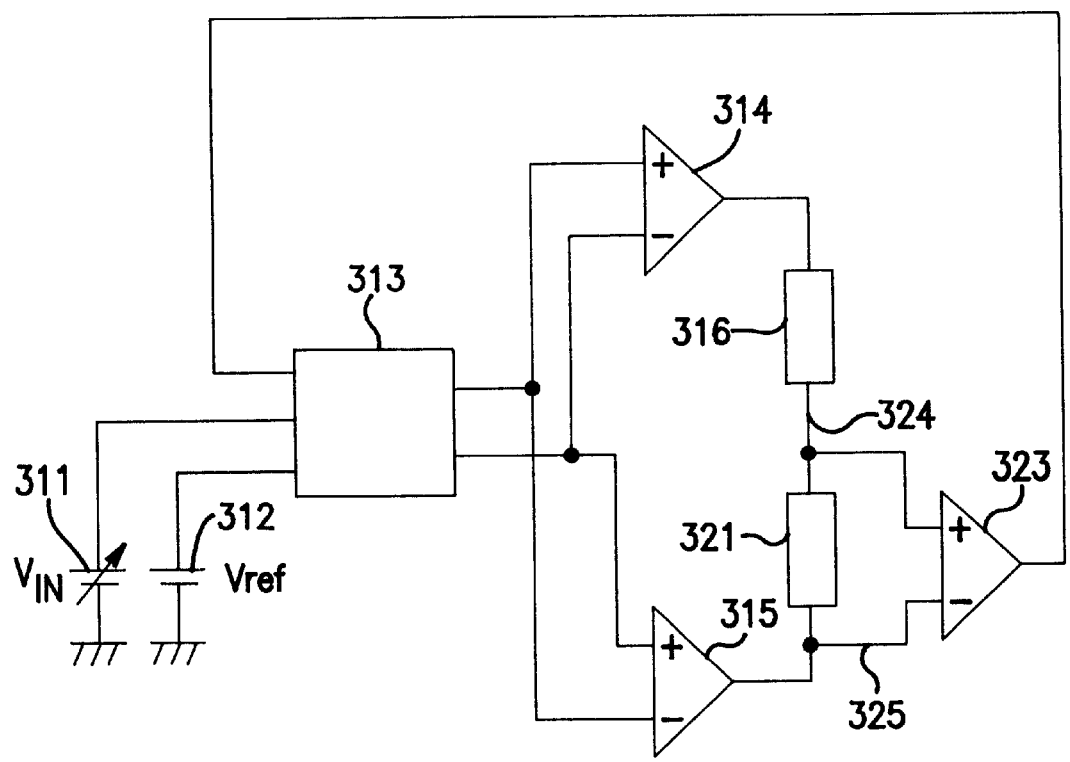
FIG. 1 is a circuit diagram illustrative of a circuit configuration of a first conventional power MOS-IC. The first conventional power MOS-IC has the following circuit elements.

The present invention provides a semiconductor device comprising: a load connected between outputs of power amplifiers; a mirror current generating circuit connected to the power amplifiers in an output side of the power amplifiers for generating a mirror current which is smaller than and proportional to a load current applied to the load, and the mirror current generating circuit being connected out of a current path through the load between the outputs of the power amplifiers; and a mirror current detecting circuit connected to the mirror current generating circuit for detecting the mirror current.

It is preferable that the mirror current generating circuit has a current detecting resistance on an output stage of the mirror current generating circuit, and the current detecting resistance is connected to the mirror current detecting circuit for enabling the mirror current detecting circuit to detect the mirror current which flows through the current detecting resistance, and the mirror current generating circuit also has the same circuit configurations as the power amplifiers.

It is also preferable that the mirror current generating circuit is connected between a power voltage supply line supplying a power voltage and a ground line, and a voltage across the current detecting resistance has a voltage center in the vicinity of a half level of the power voltage.

It is further preferable that each of the power amplifiers comprises a pair of p-channel and n-channel power MOS field effect transistors which are connected in series between the power voltage supply line and the ground line, and the mirror current generating circuit also has pairs of p-channel and n-channel current sensing MOS field effect transistors which are connected in series between the power voltage supply line and the ground line, and gates and sources of the p-channel and n-channel current sensing MOS field effect transistors are connected to gates and sources of the p-channel and n-channel power MOS field effect transistors of the power amplifiers.

It is further more preferable that the p-channel and n-channel current sensing MOS field effect transistors have the same structure as the p-channel and n-channel power MOS field effect transistors, and a ratio of the current mirror to the load current is proportional to a ratio in size of the p-channel and n-channel current sensing MOS field effect transistors to the p-channel and n-channel power MOS field effect transistors.

Accordingly, the current detecting resistance is connected not in series to the power amplifier, so that the current detecting resistance is out of the load current path to cause no power loss, wherein the current detecting sense MOS field effect transistor and the detecting resistance are applied with a current proportional to the load current of the power amplifier. No power loss enables the reduction in ON-resistance of the power MOS field effect transistors. This reduction in ON-resistance of the power MOS field effect transistors enables the reduction in area of the power MOS field effect transistors.

The above novel circuit configuration generates the voltage across the current detecting resistance, wherein the generated voltage has a voltage center at an intermediate level between the high voltage line and the ground line does not need the current detecting sense amplifier having the wide input voltage range.

The above novel circuit configuration uses the current detecting resistance having a small acceptable power because the current applied to the current detecting circuit is small and the power loss by the current detecting resistance is small.

PREFERRED EMBODIMENT

Figure 3:
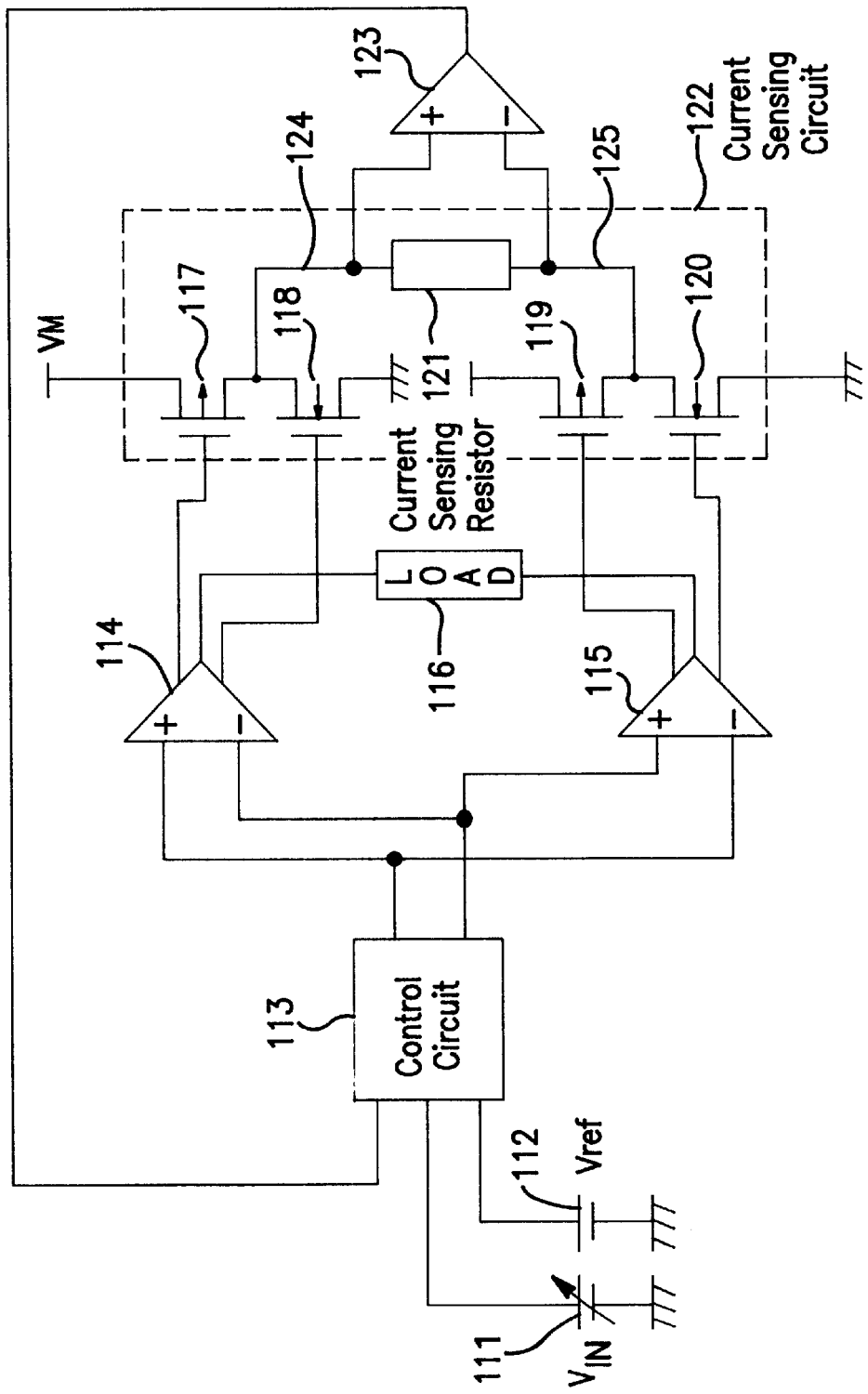
FIG. 3 is a circuit diagram illustrative of a first novel semiconductor device in a first embodiment in accordance with the present invention.

A first embodiment according to the present invention will be described in detail with reference to the drawings. FIG. 3 is a circuit diagram illustrative of a first novel semiconductor device in a first embodiment in accordance with the present invention. The first novel power MOS-IC has the following circuit elements. A control circuit 113 receives both an input signal Vin from an input power 111 and a reference voltage Vref from an input reference power 112. A first power amplifier circuit 114 is provided which has a first input which is connected to a first output of the control circuit 113 for receiving a first output signal and also has a second input which is connected to a second output of the control circuit 113 for receiving a second output signal. A second power amplifier 115 is provided which has a first input which is connected to the second output of the control circuit 113 for receiving the second output signal and also has a second input which is connected to the first output of the control circuit 113 for receiving the first output signal. A load element 116 is provided in series between outputs of the first and second power amplifiers 114 and 115. A current sense circuit 122 is also connected to an output side of the first power amplifier 114 and also connected to an output side of the second power amplifier 115 for sensing or detecting a current flowing through the load element 116. Namely, the current sense circuit 122 is connected in parallel to the load element 116 in the output side of the first and second power amplifiers 114 and 115.

Figure 2A:
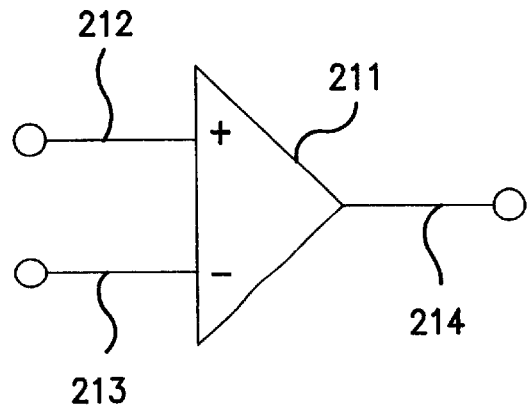
FIG. 2A is a circuit diagram illustrative of each of the first and second driver circuits included in the first conventional power MOS-IC.
Figure 2B:
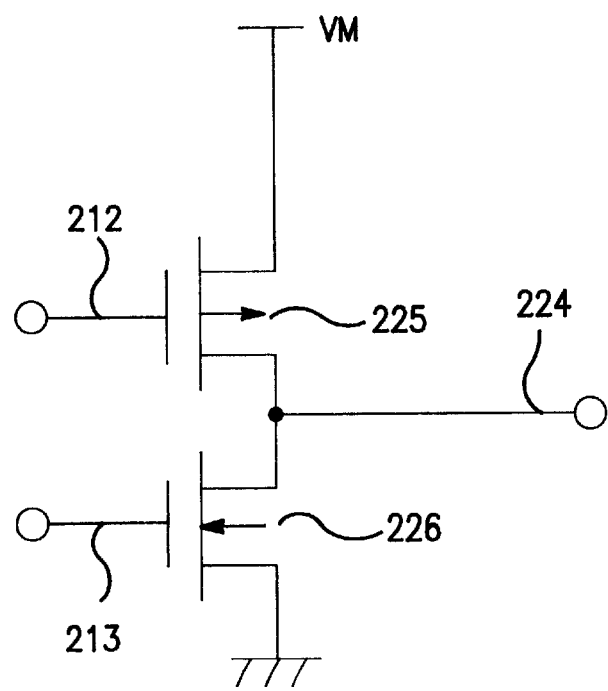
FIG. 2B is a circuit diagram illustrative of a circuit configuration of the driver circuit of FIG. 2A.

Each of the first and second power amplifiers 114 and 115 has the same circuit configuration as shown in FIG. 2B. Each of the first and second power amplifiers 114 and 115 comprises a series connection of a p-channel MOS field effect transistor 225 and an n-channel MOS field effect transistor 226 between a high voltage line supplying a voltage VM and a ground line. The p-channel MOS field effect transistor 225 and the n-channel MOS field effect transistor 226 are connected through an output node to each other. The output node is connected to an output terminal from which the output signal appears. The p-channel MOS field effect transistor 225 is connected in series between the output node and the power high voltage line, whilst the n-channel MOS field effect transistor 226 is connected in series between the output node and the ground line. A gate of the p-channel MOS field effect transistor 225 receives the first differential signal 212, whilst a gate of the n-channel MOS field effect transistor 226 receives the second differential signal 213.

The current sense circuit 122 further comprises a first series connection of a first p-channel MOS field effect transistor 117 and a first n-channel MOS field effect transistor 118 between the high voltage supply line and the ground line, and a second p-channel MOS field effect transistor 119 and a second n-channel MOS field effect transistor 120 between the high voltage supply line and the ground line, and a current detecting resistance 121. The first p-channel MOS field effect transistor 117 and the first n-channel MOS field effect transistor 118 are connected through a first output node to catch other. The first output node is connected to a first terminal 124 of the current detecting resistance 121. The first p-channel MOS field effect transistor 117 is connected in series between the first output node and the power high voltage line, whilst the first n-channel MOS field effect transistor 118 is connected in series between the first output node and the ground line. The first and second power amplifiers have first and second output stages on which the power MOS field effect transistors 225 and 226 are provided. Gates of the first p-channel MOS field effect transistor 117 and the first n-channel MOS field effect transistor 118 are connected to the gates of the p-channel power MOS field effect transistor 225 and the n-channel power MOS field effect transistor 226 of the first power amplifier 114. Sources of the first p-channel MOS field effect transistor 117 and the first n-channel MOS field effect transistor 118 are connected to the sources of the p-channel power MOS field effect transistor 225 and the n-channel power MOS field effect transistor 226 of the first power; amplifier 114. The second p-channel MOS field effect transistor 119 and the second n-channel MOS field effect transistor 120 are connected through a second output node to each other. The second output node is connected to a second terminal 125 of the current detecting resistance 121. The second p-channel MOS field effect transistor 119 is connected in series between the second output node and the power high voltage line, whilst the second n-channel MOS field effect transistor 120 is connected in series between the second output node and the ground line. Gates of the second p-channel MOS field effect transistor 119 and the second n-channel MOS field effect transistor 120 are connected to the gates of the p-channel power MOS field effect transistor 225 and the n-channel power MOS field effect transistor 226 of the second power amplifier 115. Sources of the second p-channel MOS field effect transistor 119 and the second n-channel MOS field effect transistor 120 are connected to the sources of the p-channel power MOS field effect transistor 225 and the n-channel power MOS field effect transistor 226 of the second power amplifier 115. Namely, the current detecting resistance 121 is connected in series between the first node and the second node. A sense amplifier 123 is provided which has two inputs connected to both first and second terminal sides of the current detecting resistance 121 for receiving a voltage across the current detecting resistance 121. An output of the sense amplifier 123 is connected to an input side of the control circuit 113.

The first and second p-channel MOS field effect transistors 117 and 119 and the first and second n-channel MOS field effect transistors 118 and 120 have the same structure and characteristics as the p-channel power MOS field effect transistor 225 and the n-channel power MOS field effect transistor 226 of each of the first and second power amplifiers 114 and 115. If the ratio in size of the p-channel and n-channel power MOS field effect transistors 225 and 226 to the first and second p-channel and n-channel MOS field effect transistors 117, 118, 119 and 120 is n:1, then a ratio in current of the p-channel and n-channel power MOS field effect transistors 225 and 226 to the first and second p-channel and n-channel MOS field effect transistors 117, 118, 119 and 120 is also n:1. It is assumed that the gate and the source of the power MOS field effect transistor 225 are connected to the gate and the source of the current detecting sense MOS field effect transistor 117, and that the ratio in size of the power MOS field effect transistor 225 to the current detecting sense MOS field effect transistor 117 is 1000:1. A ratio in current of the power MOS field effect transistor 225 to the current detecting sense MOS field effect transistor 117 depends on a ratio in W/L of the power MOS field effect transistor 225 to the current detecting sense MOS field effect transistor 117, wherein W represents the channel width and L represents the channel length. If the power MOS field effect transistor 225 is identical in the channel length "L" with the current detecting sense MOS field effect transistor 117, and if the ratio in the channel width "W" of the power MOS field effect transistor 225 to the current detecting sense MOS field effect transistor 117 is 1000:1, then the ratio in current of the power MOS field effect transistor 225 to the current detecting sense MOS field effect transistor 117 is also 1000:1. If the current of the load element 116 is 1A, then the current of 1 mA flows through the current detecting circuit.

The following description will focus on operations of the above novel semiconductor device. A load current flows from the p-channel power MOS field effect transistor 225 to the n-channel power MOS field effect transistor 226. The detection of the current is necessary for enabling the power amplifier to perform a current control. The current ID1 between the drain and source in the linear region of the power MOS field effect transistor 225 on the output stage of each of the power amplifiers 114 and 115 is given by the following equation (1).

$$ID1=(\tfrac{1}{2})[\{(\mu\epsilon_{OX})/(t_{OX})\}(W1/L1)\{2(V_{GS}-V_t)V_{DS}-V_{DS}^2\}] \quad (1)$$

where "W1" represents the channel width of the MOS field effect transistor 225, "L1" represents the channel length of the NMOS field effect transistor 225, "$\mu$" represents the effective mobility of carriers, "$\epsilon_{OX}$" represents the dielectric constant of the gate oxide film of the MOS field effect transistor 225, "$t_{OX}$" represents the thickness of the gate oxide film of the MOS field effect transistor 225, "$V_{GS}$" represents the gate-source voltage of the MOS field effect transistor 225, "$V_{DS}$" represents the drain-source voltage of the MOS field effect transistor 225, and "$V_t$" represents the threshold voltage of the MOS field effect transistor 225.

The current ID5 between the drain and source in the linear region of the current detecting sense MOS field effect transistor 117 is given by the following equation (2).

$$ID5=(\tfrac{1}{2})[\{(\mu\epsilon_{OX})/(t_{OX})\}(W5/L5)\{2(V_{GS}-V_t)V_{DS}-V_{DS}^2\}] \quad (2)$$

where "W5" represents the channel width of the MOS field effect transistor 117, "L5" represents the channel length of the MOS field effect transistor 117, "$\mu$" represents the effective mobility of carriers, "$\epsilon_{OX}$" represents the dielectric constant of the gate oxide film of the MOS field effect transistor 117, "$t_{OX}$" represents the thickness of the gate oxide film of the MOS field effect transistor 117, "$V_{GS}$" represents the gate-source voltage of the MOS field effect transistor 117, "$V_{DS}$" represents the drain-source voltage of the MOS field effect transistor 117, and "$V_t$" represents the threshold voltage of the MOS field effect transistor 117.

Since the MOS field effect transistor 117 has the same structure as the MOS field effect transistor 225, then the effective mobility of carriers, the dielectric constant, the thickness of the gate oxide film and the threshold voltage are the same between the MOS field effect transistor 117 and the same structure as the MOS field effect transistor 225. Since the gate and source of the MOS field effect transistor 225 are respectively connected to the gate and source of the MOS field effect transistor 117, the gate-source voltage is the same between the MOS field effect transistor 117 and the same structure as the MOS field effect transistor 225.

This circuit configuration is the current mirror circuit configuration. If the drain-source voltage is the same between the MOS field effect transistor 117 and the same structure as the MOS field effect transistor 225, then the following inter-relationship is established between the drain current ID1 of the power MOS field effect transistor 225 of each of the first and second power amplifiers 114 and 115 and the drain current ID5 of the current detecting sense MOS field effect transistor 117.

$$ID5=(W1/L1)(W5/L5)ID1 \tag{3}$$

The current detecting sense MOS field effect transistor 117 has a drain current which is proportional to a ratio in size to the power MOS field effect transistor 225 in each of the power amplifiers, whereby the load current can be detected.

A center between both potentials at the first terminal 124 and the second terminal 125 of the current detecting resistance 121 is VM/2, namely an intermediate potential level between the high voltage line and the ground potential. Thus, the voltage is generated across the first and second terminals 124 and 125 of the current detecting resistance 121. Upon applying the current to the load, for example, the current from the first power amplifier 114 to the second power amplifier 115, the potential of the first terminal 124 of the current detecting resistance 121 is shifted toward the high voltage level VM, whilst the potential of the second terminal 125 of the current detecting resistance 121 is shifted toward the ground level. If the current flows from the second power amplifier 115 to the first power amplifier 114, the potential of the first terminal 124 of the current detecting resistance 121 is shifted toward the ground level, whilst the potential of the second terminal 125 of the current detecting resistance 121 is shifted toward the high voltage level VM. This voltage across the first and second terminals 124 and 125 of the current detecting resistance 121 is inputted into the current sense amplifier 123, whereby the current sense amplifier 123 detects the load current.

Accordingly, the current detecting resistance is connected not in series to the power amplifier, so that the current detecting resistance is out of the load current path to cause no power loss, wherein the current detecting sense MOS field effect transistor and the detecting resistance are applied with a current proportional to the load current of the power amplifier. No power loss enables the reduction in ON-resistance of the power MOS field effect transistors. This reduction in ON-resistance of the power MOS field, effect transistors enables the reduction in area of the power MOS field effect transistors.

The above novel circuit configuration generates the voltage across the current detecting resistance, wherein the generated voltage has a voltage center at an intermediate level between the high voltage line and the ground line does not need the current detecting sense amplifier having the wide input voltage range.

The above novel circuit configuration uses the current detecting resistance having a small acceptable power because the current applied to the current detecting circuit is small and the power loss by the current detecting resistance is small.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A semiconductor device comprising:

a load connected between outputs of power amplifiers;

a mirror current generating circuit connected to said power amplifiers in an output side of said power amplifiers for generating a mirror current which is smaller than and proportional to a load current applied to said load, and said mirror current generating circuit being connected out of a current path through said load between said outputs of said power amplifiers; and a mirror current detecting circuit connected to said mirror current generating circuit for detecting said mirror current.

2. The semiconductor device as claimed in claim 1, wherein said mirror current generating circuit has a current detecting resistance on an output stage of said mirror current generating circuit, and said current detecting resistance is connected to said mirror current detecting circuit for enabling said mirror current detecting circuit to detect said mirror current which flows through said current detecting resistance, and said mirror current generating circuit also has the same circuit configurations as said power amplifiers.

3. The semiconductor device as claimed in claim 2, wherein said mirror current generating circuit is connected between a power voltage supply line supplying a power voltage and a ground line, and a voltage across said current detecting resistance has a voltage center in the vicinity of a half level of said power voltage.

4. The semiconductor device as claimed in claim 3, wherein each of said power amplifiers comprises a pair of p-channel and n-channel power MOS field effect transistors which are connected in series between said power voltage supply line and said ground line, and said mirror current generating circuit also has pairs of p-channel and n-channel current sensing MOS field effect transistors which are connected in series between said power voltage supply line and said ground line, and gates and sources of said p-channel and n-channel current sensing MOS field effect transistors are connected to gates and sources of said p-channel and n-channel power MOS field effect transistors of said power amplifiers.

5. The semiconductor device as claimed in claim 4, wherein said p-channel and n-channel current sensing MOS field effect transistors have the same structure as said p-channel and n-channel power MOS field effect transistors, and a ratio of said current mirror to said load current is proportional to a ratio in size of said p-channel and n-channel current sensing MOS field effect transistors to said p-channel and n-channel power MOS field effect transistors.

* * * * *